US010366321B2

(12) United States Patent
Komaki et al.

(10) Patent No.: US 10,366,321 B2
(45) Date of Patent: Jul. 30, 2019

(54) RFIC DEVICE AND METHOD FOR MANUFACTURING RESIN MOLDED BODY INCLUDING RFIC DEVICE

(71) Applicant: Murata Manufacturing Co., Ltd., Nagaokakyo-shi, Kyoto-fu (JP)

(72) Inventors: Kunihiro Komaki, Nagaokakyo (JP); Shunji Mandai, Nagaokakyo (JP); Kengo Matsumoto, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 80 days.

(21) Appl. No.: 15/676,140

(22) Filed: Aug. 14, 2017

(65) Prior Publication Data

US 2017/0344872 A1 Nov. 30, 2017

Related U.S. Application Data

(63) Continuation of application No. PCT/JP2016/051493, filed on Jan. 20, 2016.

(30) Foreign Application Priority Data

Feb. 27, 2015 (JP) ................................. 2015-039316

(51) Int. Cl.
*H01Q 1/38* (2006.01)
*H01Q 7/00* (2006.01)
*G06K 19/077* (2006.01)
*H01L 21/56* (2006.01)
*H01L 23/29* (2006.01)
*H01L 23/31* (2006.01)
*H01Q 1/22* (2006.01)

(52) U.S. Cl.
CPC ..... *G06K 19/07779* (2013.01); *G06K 19/077* (2013.01); *G06K 19/0775* (2013.01);
(Continued)

(58) Field of Classification Search
CPC ..... H01L 2924/181; H01L 2924/00012; H01L 21/56; H01L 2224/16225; H01L 23/29;
(Continued)

(56) References Cited

U.S. PATENT DOCUMENTS 6,265,977 B1 * 7/2001 Vega .................. G06K 19/0723
257/679
6,424,315 B1 * 7/2002 Glenn .............. G06K 19/07327
29/600

(Continued)

FOREIGN PATENT DOCUMENTS

JP H10-074780 A 3/1998
JP H10-328006 A 12/1998
(Continued)

OTHER PUBLICATIONS

International Search Report issued in International Application No. PCT/JP2016/051493, dated Mar. 15, 2016.

(Continued)

*Primary Examiner* — Tho G Phan
(74) *Attorney, Agent, or Firm* — Arent Fox LLP

(57) ABSTRACT

An RFIC device including a resin block having a first surface, a second surface that faces the first surface, and a through-hole that extends through the first surface and the second surface. Moreover, the RFIC device includes an RFIC element that is embedded in the resin block and a coil antenna disposed in the resin block that is connected with the RFIC element and that has a central axis that extends from the first surface to the second surface. In addition, the through-hole extends inside the coil antenna.

20 Claims, 15 Drawing Sheets

(52) U.S. Cl.
CPC . *G06K 19/07754* (2013.01); *G06K 19/07788* (2013.01); *H01L 21/56* (2013.01); *H01L 23/29* (2013.01); *H01L 23/315* (2013.01); *H01L 23/3121* (2013.01); *H01Q 1/2225* (2013.01); H01L 2224/16225 (2013.01); H01L 2924/181 (2013.01); *H01Q 1/38* (2013.01); *H01Q 7/005* (2013.01)

(58) Field of Classification Search
CPC . H01L 23/3121; H01L 23/315; G06K 19/077; G06K 19/0775; G06K 19/07754; G06K 19/0779; G06K 19/07788; H01Q 1/2225; H01Q 1/38; H01Q 7/005; H01Q 7/00
See application file for complete search history.

(56) References Cited

U.S. PATENT DOCUMENTS

| | | | | |
|---|---|---|---|---|
| 7,161,542 B2* | 1/2007 | Endo | ............... | G06K 19/0726 343/702 |
| 7,224,279 B2* | 5/2007 | Mimura | ............... | G02B 5/124 340/572.7 |
| 8,616,455 B2* | 12/2013 | Zambon | ............ | G06K 19/07722 235/380 |
| 9,065,539 B2* | 6/2015 | Saji | ..................... | H04B 1/40 |
| 9,582,693 B2* | 2/2017 | Yosui | ..................... | H01Q 7/06 |
| 2009/0091904 A1* | 4/2009 | Hatanaka | ............. | H03H 9/1021 361/764 |

FOREIGN PATENT DOCUMENTS

| | | |
|---|---|---|
| JP | 2007-133617 A | 5/2007 |
| JP | 2007-295177 A | 11/2007 |
| JP | 2008-046671 A | 2/2008 |

OTHER PUBLICATIONS

Written Opinion of the International Searching Authority issued in International Application No. PCT/JP2016/051493, dated Mar. 15, 2016.

* cited by examiner

PRIOR ART

RFIC DEVICE AND METHOD FOR MANUFACTURING RESIN MOLDED BODY INCLUDING RFIC DEVICE

CROSS-REFERENCE TO RELATED APPLICATIONS

The present application is a continuation of PCT/JP2016/051493 filed Jan. 20, 2016, which claims priority to Japanese Patent Application No. 2015-039316, filed Feb. 27, 2015, the entire contents of each of which are incorporated herein by reference.

TECHNICAL FIELD

The present disclosure relates to an RFIC device and a method for manufacturing a resin molded body including the RFIC device.

BACKGROUND ART

RFID systems are used as information management systems for commodity management, electronic settlement, and the like. In an RFID system, a contactless communication is made between a reader/writer and an RFID tag to transfer predetermined information. An RFID tag includes an RFIC chip for storing predetermined information and processing predetermined radio signals, and an antenna for transmitting/receiving high-frequency signals. In commodity management, for example, RFID tags are attached to commodities to be managed.

Generally, RFID tags are attached to the surface of a commodity, but RFID tags may also be embedded in a commodity by injection molding, for example. For example, FIG. 22 is a schematic diagram showing a flow 55 of resin in injection molding with a conventional RFID tag 51. The RFID tag 51 is generally in the shape of a flat board and includes an RFIC chip on an antenna board. In injection molding with the RFID tag 51, molding resin 54 comes into contact with the tag and the flow of the injected resin may be blocked by the tag. As a result, molding resin 54 may not fully fill the inside of a mold 52, leaving some resin-absent cavities, or the pressure by resin may move the RFID tag, causing the misalignment of the RFID tag. In addition, since the RFID tag 51 is subjected to the flow of hot resin, the thermal loads accumulated in the RFID tag 51 may damage the RFIC chip in the RFID tag 51. Moreover, The possibility of the RFIC chip being damaged increases even more when the tag is inevitably disposed such that its large surface directly faces the flow of resin.

Patent Document 1: Japanese Patent Laid-open Publication No. 2007-133617.

To protect the RFIC chip from the heat of resin, the surface of the RFID tag should be covered with a heat-resistant laminated sheet to protect the tag from the heat in injection molding, as disclosed in Patent Document 1 (identified above), for example.

The heat-resistant sheet, however, may further hinder molding resin from going behind the tag, leaving some resin-absent cavities, or move the tag from a predetermined position. In addition, the heat-resistant sheet made of a certain material or having a certain thickness may impair the communication properties of the RFID tag.

SUMMARY

An object of the present disclosure is to provide an RFIC device that prevents the resin-absent cavities and the misalignment in molding while maintaining its good communication properties.

In an exemplary embodiment, an RFIC device is provided that includes a resin block having a first surface, a second surface facing the first surface, and a through-hole penetrating the first surface and the second surface. Moreover, an RFIC element is embedded in the resin block, and a coil antenna is disposed in the resin block, connected with the RFIC element, and has a central axis extending from the first surface to the second surface, in which the through-hole is provided inside the coil antenna.

In the RFIC device of the exemplary embodiment, since the resin block has the through-hole penetrating the first surface and the second surface inside the coil antenna, molding resin can flow through the through-hole in injection molding, which prevents the RFIC device (RFID tag) from being damaged while maintaining the communication properties of the RFIC device (RFID tag).

DETAILED DESCRIPTION

Figure 1:
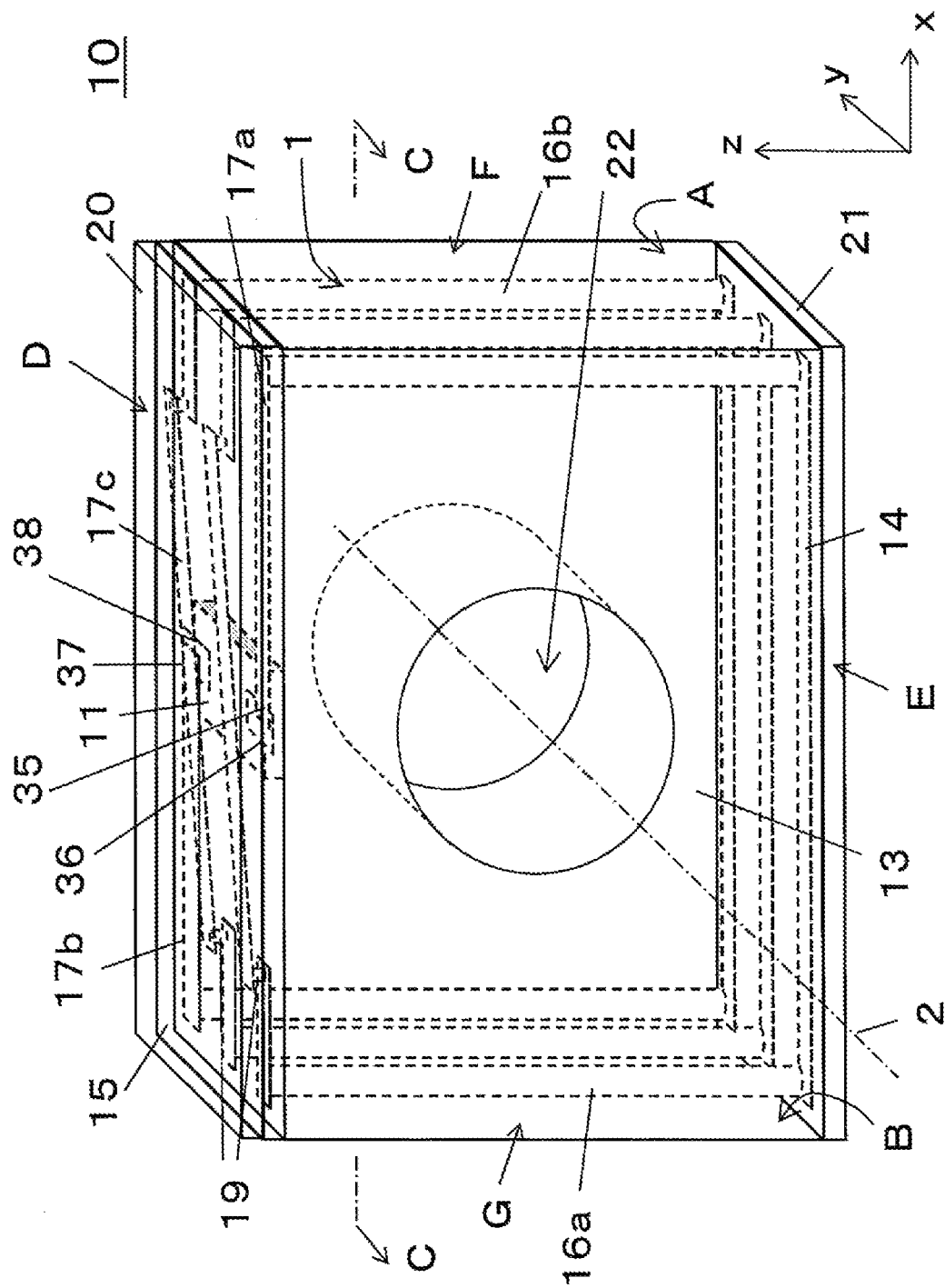
FIG. 1 is a perspective view of an RFIC device of a first embodiment.

According to an exemplary embodiment, an RFIC device is provided that includes a resin block having a first surface, a second surface facing the first surface, and a through-hole penetrating the first surface and the second surface, an RFIC element embedded in the resin block, and a coil antenna disposed in the resin block, connected with the RFIC element, and having a central axis extending from the first surface to the second surface, wherein the through-hole is provided inside the coil antenna.

In the above structure, since the resin block has the through-hole penetrating the first surface and the second surface, molding resin can flow through the through-hole in injection molding, which prevents the RFIC device (RFID tag) from being damaged. In addition, since the through-hole is provided inside the antenna coil, the size of the coil antenna (especially the opening area of the coil) can be maintained and the relative distance of the coil antenna with respect to a counterpart communication antenna (the antenna of a reader/writer) is not decreased significantly, allowing the RFIC device to have good communication properties with a long communication distance.

In an RFIC device of another embodiment, the resin block may be a polyhedral solid and have the through-hole penetrating the first surface and the second surface that are opposite surfaces. In this aspect, the first surface has the largest surfaces of the resin block and the resin block is typically a rectangular solid.

In the above structure, since the through-hole is disposed in the first and second surfaces and the first surface has the largest area in the resin block, the through-hole can be large. As a result, the large through-hole facilitates the flow of resin in molding. In addition, the distance between the RFIC element embedded in the resin block and the through-hole can be kept to a certain degree in the resin block.

In an RFIC device of yet another embodiment, which can be a refinement of any one of the above embodiments, the coil antenna may at least partially be embedded in the resin block and include the first metal pin and the second metal pin that are opposite to each other.

In the above structure, since the metal pins are disposed along both side surfaces of the resin block of the RFIC device, the thermal and mechanical shock resistances of the coil antenna can be enhanced, which enhances the robustness of the RFIC device as a whole.

In an RFIC device of yet another embodiment, which can be a refinement of any one of the above embodiments, the central axis of the through-hole may be disposed at an offset position from the central axis of the coil antenna to the side away from the RFIC element when viewed in the direction orthogonal to the first surface.

In the above structure, the RFIC element can be disposed away from the through-hole that is subjected to the dynamic and thermal loads of molding resin flowing inside, which reduces the dynamic and thermal loads of molding resin on the RFIC element.

In an RFIC device of yet another embodiment, which can be a refinement of any one of the above embodiments, the coil antenna may be a helical member disposed in the direction from the first surface to the second surface.

In an RFIC device of yet another embodiment, which can be a refinement of any one of the above embodiments, the coil antenna may include a first pattern conductor disposed on one surface orthogonal to the first and second surfaces of the resin block, a connecting conductor disposed on the surface opposite to the one surface, and two metal pins extending from the one surface to the opposite surface and connecting the first pattern conductor and the connecting conductor, with the two metal pins being opposite to each other.

In the above structure, since the metal pins connect the one surface and the opposite surface, the thermal and mechanical shock resistances of the RFIC device can be enhanced. The metal pins can transfer heat along the flow of resin (from the upstream area to the downstream area of the flow) to the outside of the RFIC device, which prevents the heat from staying inside the RFIC device.

In an RFIC device of yet another embodiment, which can be a refinement of any one of the above embodiments, the resin block may have a plurality of grooves in the surface orthogonal to the first and second surfaces. The inner wall of the through-hole also should preferably have a plurality of grooves orthogonal to the first and second surfaces.

In the above structure, the grooves can facilitate the flow of molding resin in injection molding, which improves the flowability of molding resin and prevents occurrence of defects in molding such as resin-absent cavities due to insufficient resin flow, and the damage to the RFIC element due to heat concentration.

In an RFIC device of yet another embodiment, which can be a refinement of any one of the above embodiments, the edges of the first and second surfaces of the resin block may be chamfered. The edges of the through-hole also should preferably be chamfered.

In the above structure, when molding resin comes into contact with the RFIC device in injection molding, the chamfered edges allow the molding resin to continue to flow smoothly, which improves the flowability of molding resin and prevents occurrence of defects in molding such as resin-absent cavities due to insufficient resin flow, and the damage to the RFIC element due to heat concentration.

In an RFIC device of yet another embodiment, which can be a refinement of any one of the above embodiments, the RFIC device may have heat insulating material to cover the resin block. The inner wall of the through-hole should also preferably be covered with heat insulating material.

The above structure prevents rapid change in temperature inside the resin block in injection molding and prevents the RFIC element from being damaged.

In an RFIC device of yet another embodiment, which can be a refinement of any one of the above embodiments, the RFIC device is used for injection molding.

In an RFIC device of yet another embodiment, which can be a refinement of any one of the above embodiments, the resin block may have a plurality of through-holes.

According to an exemplary embodiment, a resin molded body includes an RFIC device, and a resin part including the RFIC device inside, wherein the RFIC device includes a resin block having a first surface, a second surface facing the first surface, and a through-hole penetrating the first surface and the second surface. Moreover, an RFIC element is provided that is embedded in the resin block, and a coil antenna is disposed in the resin block, connected with the RFIC element, and has a central axis extending from the first surface to the second surface, wherein the through-hole is provided inside the coil antenna. In this resin molded body, the molded resin is in contact with the inner wall of the through-hole in the resin block as well as the outer surface of the resin block, which enhances the reliability of the RFIC device against mechanical shock to the resin molded body.

According to an exemplary embodiment, a method is provided for manufacturing a resin molded body including an RFIC device. In this aspect, the method includes disposing the RFIC device in a mold, where the RFIC device including a resin block having a through-hole, an RFIC element embedded in the resin block, a coil antenna disposed in the resin block, connected with the RFIC element, and surrounding the through-hole, so that the through-hole directly faces the flow of resin in the mold. The method further includes injecting molding resin from a resin injection port into the mold to embed the RFIC device in the resin molded body.

In the above structure, since the RFIC device is disposed in the mold so that the through-hole directly faces the flow of resin in the mold, molding resin can flow through the through-hole in injection molding, which prevents the RFIC device from blocking the flow of molding resin.

RFIC devices of certain exemplary embodiments will now be described with reference to the accompanying drawings. In the drawings, substantially identical elements are provided with identical reference numerals.

(First Embodiment)

Figure 2:
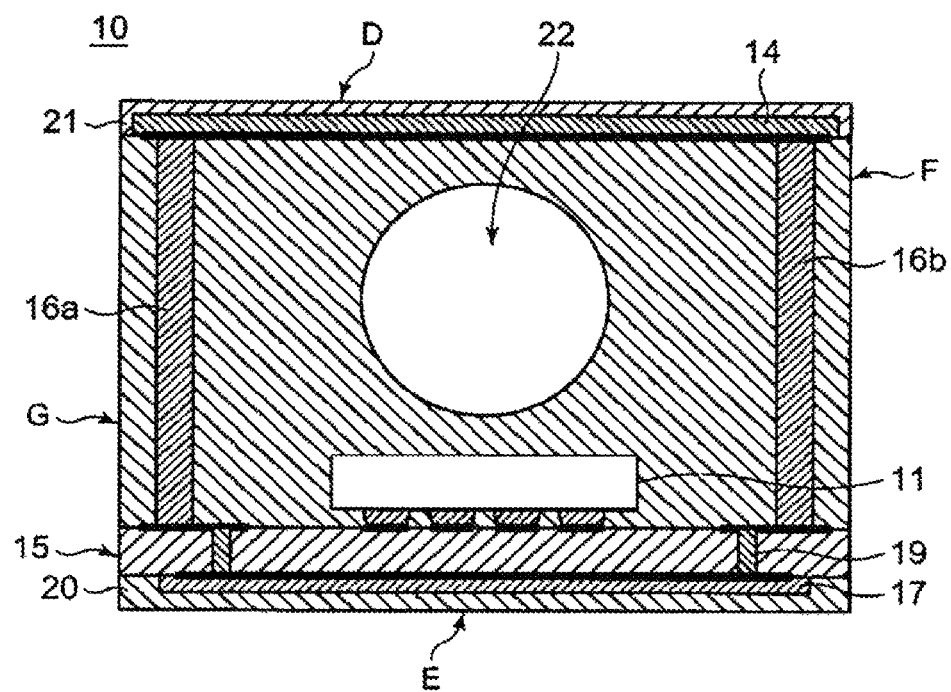
FIG. 2 is a cross-sectional view of the RFIC device of FIG. 1 taken along the line C-C when viewed upside down.

FIG. 1 is a perspective view of an RFIC device 10 of a first embodiment. FIG. 2 is a cross-sectional view of the RFIC device 10 of FIG. 1 taken along the line C-C, when viewed upside down. As shown in FIGS. 1 and 2, the RFIC device 10 includes: a resin block 13, an RFIC element 11 embedded in the resin block 13, and a coil antenna 1.

More specifically, the RFIC device 10 of the first embodiment includes a circuit board 15 mounted with the RFIC element 11; metal pins 16a and 16b provided on the circuit board 15; and a connecting conductor 14 connecting the metal pins 16a and 16b. Furthermore, the resin block 13 includes the RFIC element 11 and the metal pins 16a and 16b, and having a through-hole 22; and the coil antenna 1 including wiring patterns 17a, 17b, and 17c on the circuit board 15, the metal pins 16a and 16b, and the connecting conductor 14, and surrounding the through-hole 22.

<Resin Block>

The resin block 13 is a rectangular solid having a first surface A, a second surface B facing the first surface A, an upper surface D, a lower surface E, and two side surfaces F and G. The surfaces D, E, F, and G connect the first surface A and the second surface B. Each of the first surface A and the second surface B has a larger area than the upper surface D, the lower surface E, and the two side surfaces F and G. The upper surface D and the lower surface E are disposed in the positive and negative directions of the z-axis of FIG. 1, respectively. Each of the upper surface D and the lower surface E has a larger area than the two side surfaces F and G. The two side surfaces F and G are disposed in the positive and negative directions of the x-axis of FIG. 1, respectively.

The first surface A is disposed in the positive direction of the y-axis of FIG. 1 or at the back. The second surface B is disposed in the negative direction of the y-axis of FIG. 1 or at the front.

The resin block 13 has a through-hole 22 penetrating the first surface A and the second surface B. In an exemplary aspect, the through-hole 22 is disposed in the largest surface of the rectangular solid resin block 13. It should be appreciated that this does not mean that these largest surface has actually the largest surface area, but rather that this largest surface has the largest projected area, which is determined by projecting each surface on a flat surface. The through-hole 22 is provided substantially at the center of the first surface A and the second surface B. The through-hole is a round opening and has a diameter substantially equal from the first surface A to the second surface B. The diameter of the through-hole 22 is not limited to a diameter substantially equal from the first surface A to the second surface B. The through-hole 22 may have a diameter that gradually or continuously changes. The through-hole 22 may have different diameters at the first surface A and the second surface B. The through-hole 22 should preferably account for $\frac{1}{20}$ to $\frac{1}{3}$ of the first surface A and/or the second surface B, considering the balance between the strength of the resin block and the flowability of resin for injection molding.

It is noted that the shape of the through-hole 22 in the resin block 13 is not necessarily limited to a round shape as described above. The through-hole 22 may have an oval, triangular, rectangular, pentagonal, or any polygonal shape.

The resin block 13 can be made of epoxy thermosetting resin, for example. The resin block 13 may be made of other thermosetting resins such as phenolic resin, melamine resin, urea resin, polyurethane, and thermosetting polyimide, than epoxy thermosetting resin. The resin block 13 may be formed by applying and curing liquid resin or by using a semi-cured laminated resin sheet.

The resins for the resin block 13 may contain magnetic powder such as ferrite powder. When the resin block 13 contains magnetic powder, the whole size of the coil antenna with a predetermined inductance can be reduced.

Since the resin block 13 has the through-hole 22 penetrating the first surface A and the second surface B, each having the largest area in the resin block 13, the through-hole 22 can be formed large. The large through-hole 22 facilitates the flow of resin in molding, which prevents the RFIC element 11 from being damaged.

<Coil Antenna>

The coil antenna 1 is disposed in the resin block 13 and connected with the RFIC element 11. More specifically, one end 35 of the coil antenna 1 is connected to a first input/output terminal 36 of the RFIC element 11 and the other end 37 of the coil antenna 1 is connected to a second input/output terminal 38 of the RFIC element 11. The coil antenna 1 has a central axis 2 extending from the first surface A to the second surface B.

The coil antenna 1 has a helical shape formed by helically connecting and winding a conductive member. The central axis 2 corresponds to the virtual line connecting the center of the first surface A and the center of the second surface B. The conductive members of the coil antenna 1 extends along the two side surfaces, the upper surface D, and the lower surface E of the resin block 13. The opening area of the coil antenna 1 is thus substantially equal to the area of the first surface A or the second surface B.

The coil antenna 1 includes the wiring patterns 17a, 17b, and 17c on the circuit board 15, the metal pins 16a and 16b on the circuit board 15, and the connecting conductive pattern 14 connecting the metal pins 16a and 16b, on the side opposite to the circuit board 15. In this aspect, the metal pins 16a can be a plurality of conductive members arranged at regular intervals in the direction of the central axis of the coil antenna 1 along one side surface of the resin block 13 while the metal pins 16b are a plurality of conductive members arranged at regular intervals in the direction of the central axis of the coil antenna 1 along the other side surface of the resin block 13. These metal pins are embedded in the resin block 13, however, they may partially be exposed in one aspect. The wiring patterns 17a, 17b, and 17c on the circuit board 15 are made of metal thin films formed on the front and back surfaces of the circuit board 15, an interlayer connecting conductor 19 in the circuit board 15 is a conductive member connecting the wiring patterns on the inner main surface of the circuit board with the wiring patterns on the outer main surface of the circuit board. The connecting conductive pattern 14 is a conductive member formed on the lower surface of the resin block 13 and made of a metal sintered body and conductive resin material formed on the outer surface of the lower surface of the resin block 13. According to the exemplary aspect, these conductive members constitute the coil antenna 1.

More specifically, the lower end of each metal pin 16a is connected to one end of the wiring pattern 14 made of a metal sintered body and conductive resin material, the upper end of each metal pin 16a is connected to one end of the wiring pattern 17 made of a metal thin film, while the lower end of each metal pin 16b is connected to the other end of the wiring pattern 14 made of a metal sintered body and conductive resin material, and the upper end of each metal pin 16b is connected to the other end of the wiring pattern made of a metal thin film. The metal thin film, and the metal sintered body and conductive resin material should preferably be plated. The through-hole 22 is provided inside the coil antenna 1 so that the central axis of the through-hole 22 substantially corresponds to the central axis 2 of the coil antenna 1.

It should be appreciated that the coil antenna 1 is not limited to one with multiple windings as shown in FIG. 1. The coil antenna 1 may be a single loop, for example.

In FIG. 1, all the distances between the facing pairs of the metal pins 16a and the metal pins 16b are equal, however, some pairs of the metal pins 16a and the metal pins 16b may have a wider distance and the other pairs may have a narrower distance in all the pairs of the metal pins 16a and the metal pins 16b along the side surfaces of the resin block 13. The pairs of the metal pins having different distances prevent the leak of magnetic flux from the rectangular helical coil.

<Circuit Board>

In an exemplary aspect, the circuit board 15 may be an epoxy resin FR 4 board, for example. The circuit board 15 should preferably be a heat-resistant printed circuit board made of epoxy resin, for example. The wiring patterns 17a, 17b, and 17c, and a land pattern 24 (e.g., FIG. 5) are formed on the front and back surfaces of the circuit board 15. In an FR 4 board, the interlayer connecting conductor 19 is in the form of a through-hole. The interlayer connecting conductor 19 can be formed by plating Cu, for example. The wiring pattern 17 and the land pattern 24 can typically be formed by patterning Cu foils. The wiring pattern 17 and the land pattern 24 should preferably be plated with Ni/Au, for example.

The circuit board 15 may not be a resin board. The circuit board 15 may be a ceramic board made of low temperature co-fired ceramics (LTCC), for example. In this case, the interlayer connecting conductor 19 is in the form of a via hole filled with conductive paste mainly composed of Cu or Ag.

<Metal Pins (Metal Posts)>

The metal pins 16a and 16b may mainly be composed of Cu. The metal pins 16a and 16b may be composed of other conductive materials such as Ag and Al, other than Cu. The metal pins 16a and 16b may have an outer diameter $\varphi$ in the range of 0.2 mm to 1 mm, for example. The metal pins 16a and 16b may have a length in the range of 3 mm to 50 mm, for example. The metal pins 16a and 16b should preferably have a round cross section, however, may have a rectangular cross section. The aspect ratio of the rectangular cross section should preferably be in the range of 5 to 30. The metal pins 16a and 16b may be plated with Ni/Au, for example.

The metal pins 16a and 16b are connected to the land pattern 24 on the circuit board 15 with conductive connecting material 23 (e.g., FIG. 5) such as solder.

Since the metal pins 16a and 16b are disposed along both side surfaces of the resin block 13, the RFIC device 10 has robustness to endure mechanical shock. When manufacturing a resin molded body including the RFIC device 10, the metal pins 16a and 16b transfer heat to the outside of the RFIC device 10, which prevents the heat from staying inside the RFIC device 10.

<Conductive Connecting Material>

The conductive connecting material 23 for connecting the metal pins 16a and 16b to the land pattern 24 on the circuit board 15 may be Sn—Ag solder, for example. The conductive connecting material 23 is not limited to the above material.

<RFIC Element>

The RFIC element 11 is mounted on the inner main surface of the circuit board 15. The RFIC element 11 has a base band (BB) circuit or a radio frequency (RF) circuit, for example. The RFIC element 11 may be a bare chip or a chip in a resin or ceramic package. The RFIC element 11 may be mounted in any mounting form such as a ball grid array (BGA) or a land grid array (LGA).

Figure 3:
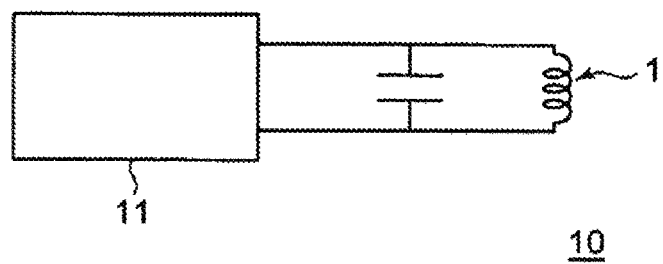
FIG. 3 is an equivalent circuit diagram of the RFIC device of the first embodiment.

FIG. 3 is an equivalent circuit diagram of the RFIC device 10 as an example. In the equivalent circuit diagram, the RFIC device 10 includes the RFIC element 11, the coil antenna 1, and a capacitor (not shown). The capacitor may be stray capacitance in the RFIC element 11, for example.

As described below with reference to FIG. 17, the RFIC device 10 may have grooves or slits in its surface. Alternatively, as shown in FIG. 18, the RFIC device 10 may have chamfered edges.

<Advantageous Effects>

Figure 4:
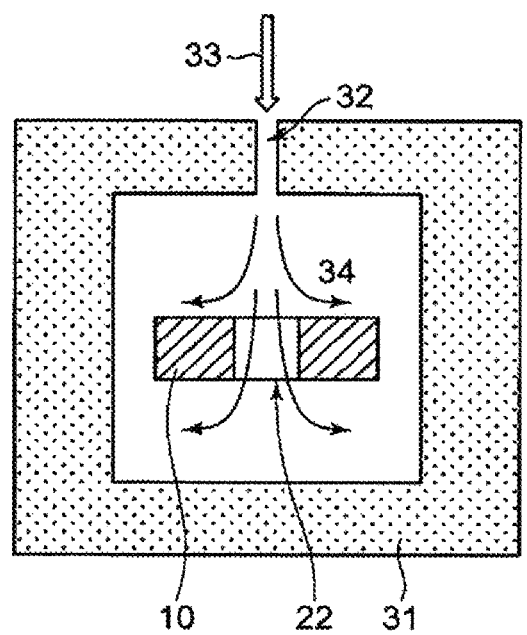
FIG. 4 is a schematic diagram showing the flow of resin in injection molding with the RFIC device of the first embodiment.

FIG. 4 is a schematic diagram showing a flow 34 of resin in injection molding with the RFIC device 10 of the first embodiment. In the RFIC device 10 of the first embodiment, since the resin block 13 has the through-hole 22 penetrating the first surface and the second surface, molding resin 34 can flow through the through-hole 22 in injection molding, which prevents the RFIC device from being damaged. In addition, the RFIC device 10 does not block the flow of molding resin 33. In this case, the RFIC device 10 should be disposed so that the through-hole 22 directly faces the flow of molding resin 34, as described below. This allows molding resin 34 to smoothly flow into the through-hole 22.

In addition, according to the exemplary aspect, molding resin 34 can fully fill the inside of the mold 31, which prevents resin-absent cavities, and the pressure by resin does not move the RFIC device 10, which prevents the misalignment of the RFIC device 10. As a result, a highly reliable resin molded body including the RFIC device 10 can be obtained. Since the resin molded body can be made in a short time, the heat of molding resin does not concentrate in the RFIC element 11, which decreases the possibility of the RFIC element 11 being damaged by heat.

Since the RFIC device 10 can be positioned accurately in a resin molded body, the reader/writer can be held over the right place where the RFIC device 10 is placed. This ensures good communication properties of the RFIC device even when the RFIC device has only a short communication distance.

<Method for Manufacturing RFIC Device>

A method for manufacturing the RFIC device 10 will now be described with reference to FIGS. 5 to 12. The exemplary method is described below with respect to steps (a) through (h).

Figure 5:
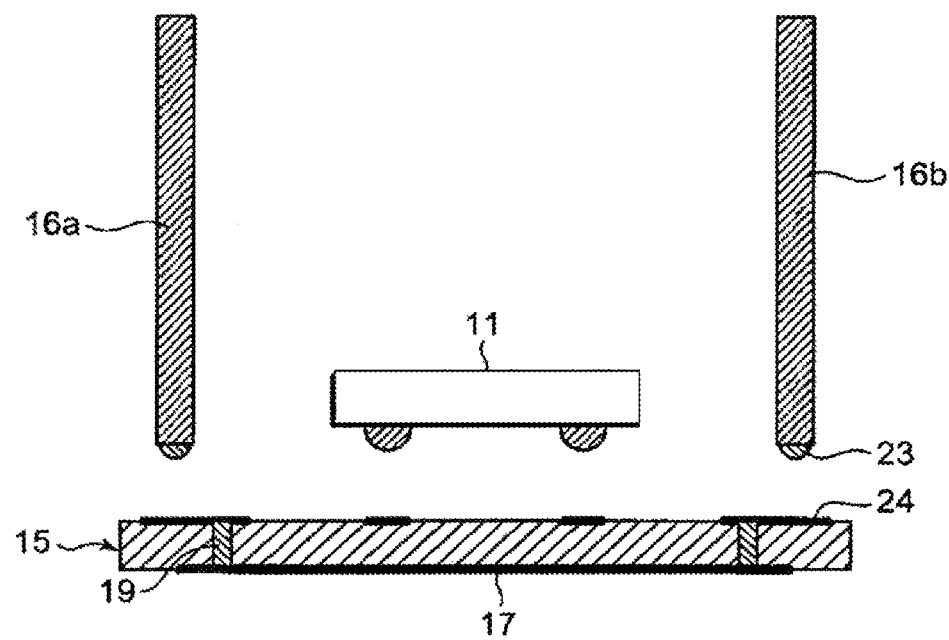
FIG. 5 is a schematic diagram showing a process for mounting an RFIC element and metal pins on a circuit board in a method for manufacturing the RFIC device of the first embodiment.

(a) First, the circuit board 15 and the metal pins 16a and 16b are prepared. The circuit board 15 has the wiring patterns 17a, 17b, and 17c, which have been formed by patterning metal foils. The circuit board 15 also has the interlayer connecting conductor 19, which has been formed by plating or filling paste. As shown in FIG. 5, the RFIC element 11 and the metal pins 16a and 16b are mounted on one main surface of the circuit board 15 with a mounter. The RFIC element 11 is provided with some solder balls at the portions to be connected to the circuit board 15. The metal pins are also provided with solder paste at the lower ends by printing. Other elements such as a capacitor chip may be mounted on the circuit board 15 when necessary (not shown).

Figure 6:
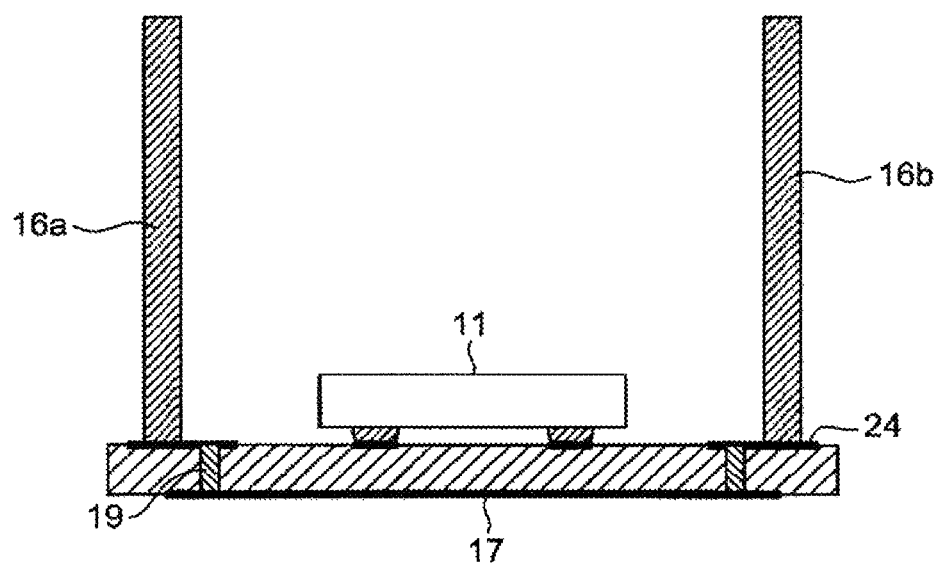
FIG. 6 is a schematic diagram showing the state in which the RFIC element and the metal pins are mounted on the circuit board in the process of FIG. 5.

(b) As shown in FIG. 6, these are subjected to heat treatment, typically reflow, so that the RFIC element 11 and the metal pins 16a and 16b are secured to the circuit board 15.

Figure 7:
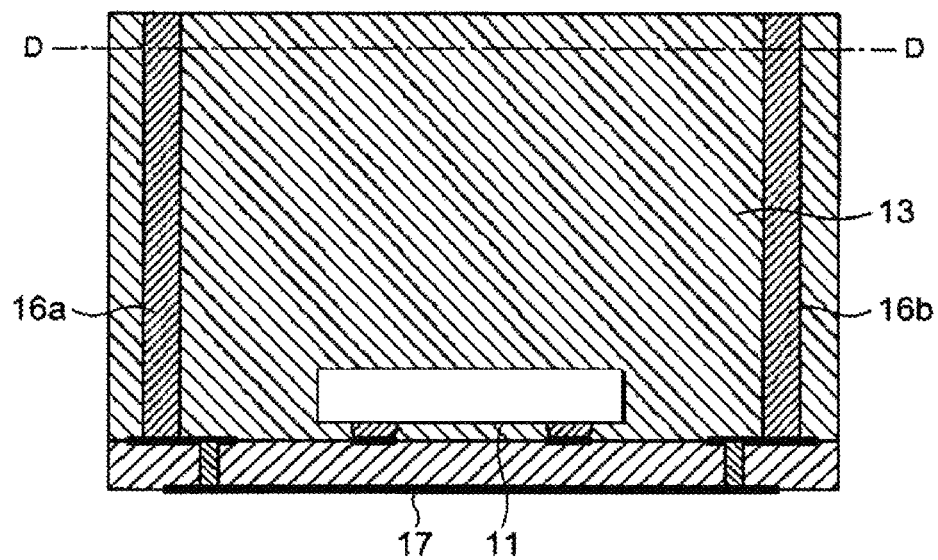
FIG. 7 is a schematic diagram showing a process for forming a resin block and a process for polishing the upper surface in the method for manufacturing the RFIC device of the first embodiment.

(c) As shown in FIG. 7, the resin block (resin layer) 13 is then formed to enclose the RFIC element 11. The resin block 13 may be formed by applying and curing epoxy thermosetting resin, for example, or by using a semi-cured resin sheet.

Figure 8:
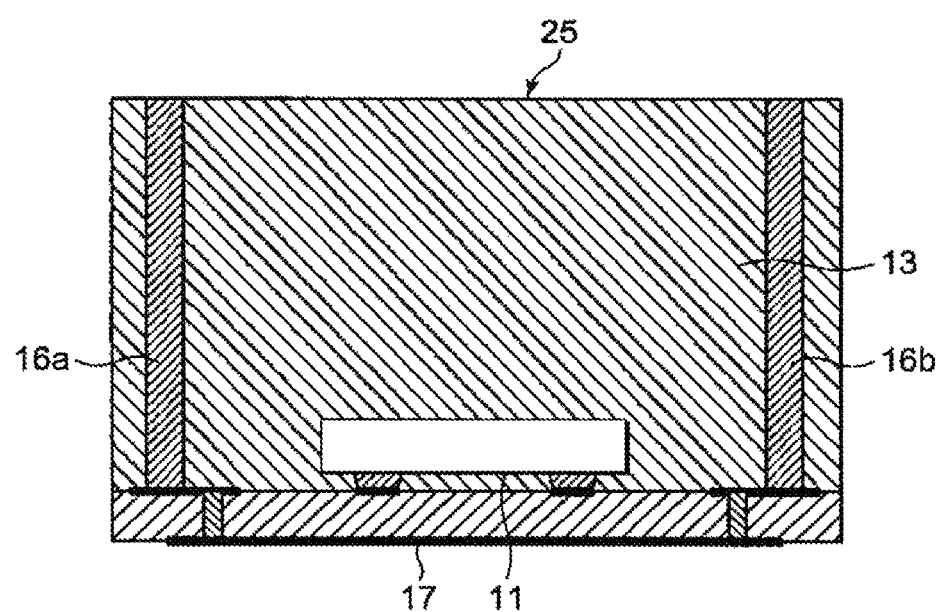
FIG. 8 is a schematic diagram showing the polished upper surface after the processes of FIG. 7.

(d) As shown in FIG. 8, the top surface is then polished. The top surface is polished to smoothen the irregular surface of the crude resin block 13 for forming a wiring pattern and to expose the heads of the metal pins 16a and 16b if these pins are completely embedded in the resin block. The top surface is polished to the line D-D of FIG. 7, for example, to obtain a polished surface 25.

Figure 9:
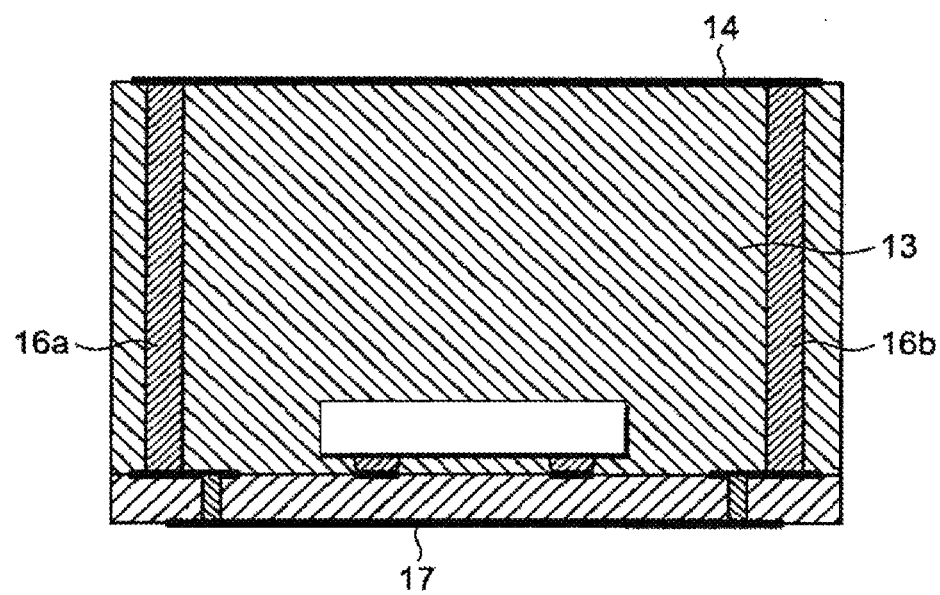
FIG. 9 is a schematic diagram showing a process for printing a wiring pattern on the upper surface in the method for manufacturing the RFIC device of the first embodiment.

(e) As shown in FIG. 9, the wiring pattern 14 is then formed on the polished surface 25. The wiring pattern 14 is formed as follows. Conductive material mainly composed of Cu is screen printed and heat treated to be cured. The wiring pattern (printing) 14 is formed in this way.

Figure 10:
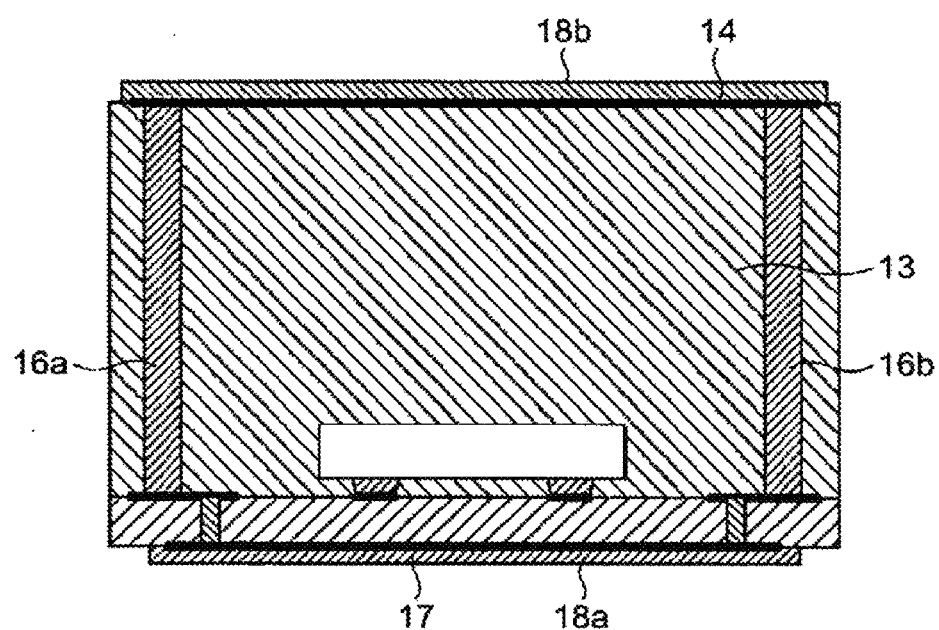
FIG. 10 is a schematic diagram showing a process for plating the wiring patterns on the upper and lower surfaces in the method for manufacturing the RFIC device of the first embodiment.

(f) As shown in FIG. 10, the wiring pattern 14 is plated with Ni/Au, for example, to form a plating layer 18b on the wiring pattern 14. After the plating, the wiring pattern 17 on the lower surface of the circuit board 15 is plated to form a plating layer 18a on the wiring pattern 17. The pattern layer 17 and the plating layer 18a form the wiring pattern 17 on the outer main surface of the circuit board 15, and the printed wiring pattern layer 14 and the plating layer 18b form the connecting conductive pattern 14.

Figure 11:
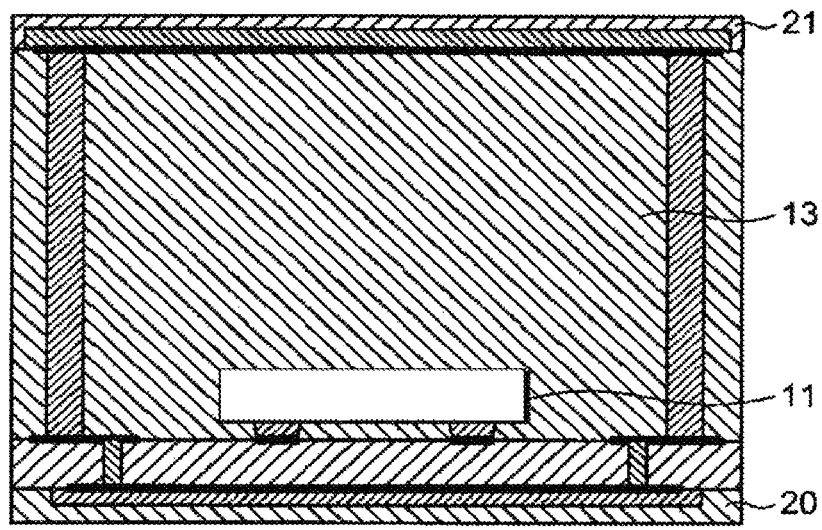
FIG. 11 is a schematic diagram showing a process of forming a first protective layer on the lower surface and a second protective layer on the upper surface in the method for manufacturing the RFIC device of the first embodiment.

(g) As shown in FIG. 11, protective layers 20 and 21 are then formed on the lower and upper surfaces, respectively. In one aspect, the protective layers 20 can be composed of resist material. The protective layers 20 and 21 may be formed on the entire lower and upper surfaces. Alternatively, the protective layers may be formed partially on the lower and upper surfaces as necessary.

Figure 12:
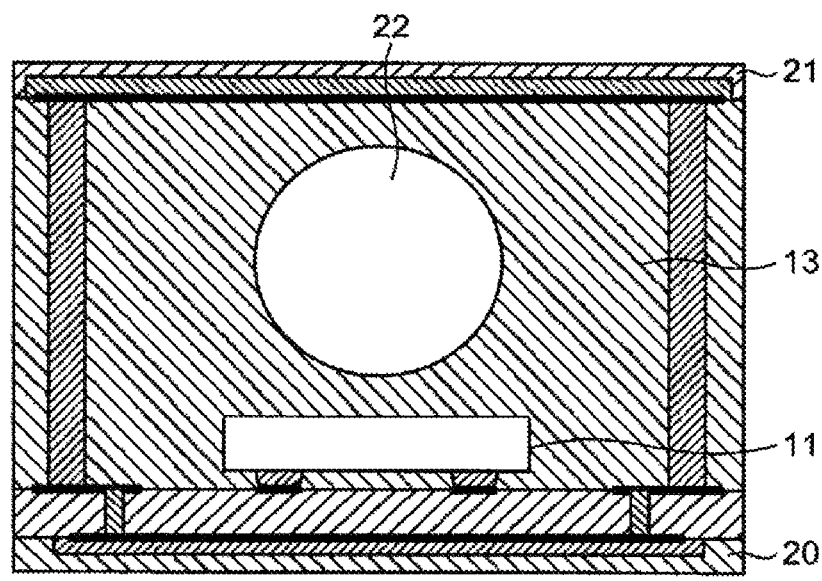
FIG. 12 is a schematic diagram showing a process for forming a through-hole penetrating a first surface and a second surface that are orthogonal to the upper and lower surfaces in the method for manufacturing the RFIC device of the first embodiment.

(h) Finally, as shown in FIG. 12, the through-hole 22 is formed to penetrate the resin block 13 from the first surface to the second surface. The through-hole 22 can be formed in various processing methods such as laser processing, drilling, and punching.

As described above, the RFIC device 10 can be obtained according to the exemplary manufacturing method.

<Resin Molded Body or Toy Including RFIC Device>

Figure 13A:
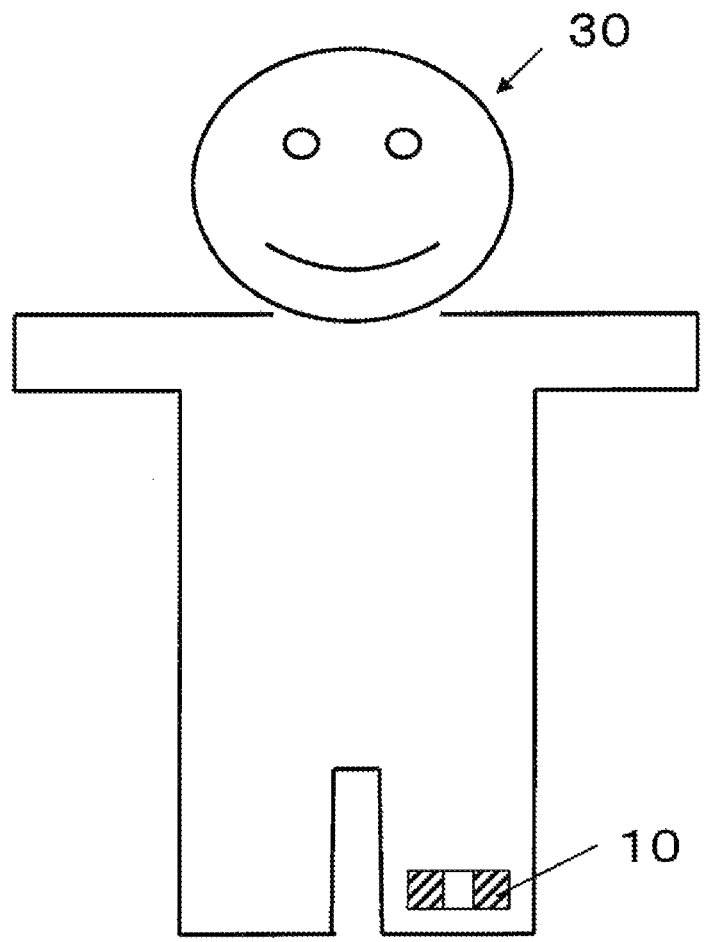
FIG. 13A is a schematic diagram of a resin molded body or a toy including the RFIC device of the first embodiment.
Figure 13B:
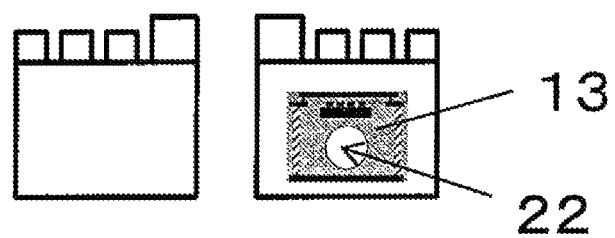
FIG. 13B is a bottom view of the toy of FIG. 13A when viewed from the sole of the toy.
Figure 14:
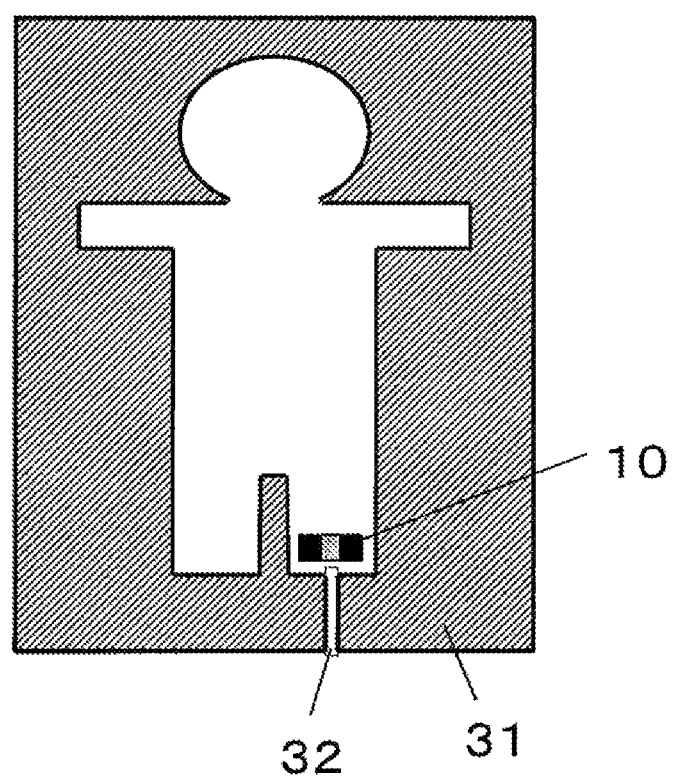
FIG. 14 is a schematic diagram showing the RFIC device disposed in a mold used for manufacturing the resin molded body of FIG. 13A by injection molding.

FIG. 13A is a schematic diagram of a resin molded body or a toy 30 including the RFIC device 10 of the first embodiment. FIG. 13B is a bottom view of the toy 30 of FIG. 13A when viewed from the sole of the toy. FIG. 14 is a schematic diagram showing the RFIC device 10 disposed in a mold 31 used for making the resin molded body 30 of FIG. 13A by injection molding.

The resin molded body or toy 30 includes the RFIC device 10 in its foot area. The RFIC device 10 has the through-hole 22 penetrating the resin block 13 from the first surface to the second surface.

As shown in FIG. 14, in injection molding for making the resin molded body or toy 30, the RFIC device 10 is disposed in a mold so that the through-hole 22 directly faces the flow of molding resin in the mold. More specifically, the RFIC device 10 may be disposed to face a pin gate 32 in the mold 31. This allows molding resin to smoothly flow into the through-hole in the RFIC device 10 in injection molding, which prevents the RFIC device from blocking the flow of molding resin 34.

(Second Embodiment)

Figure 15:
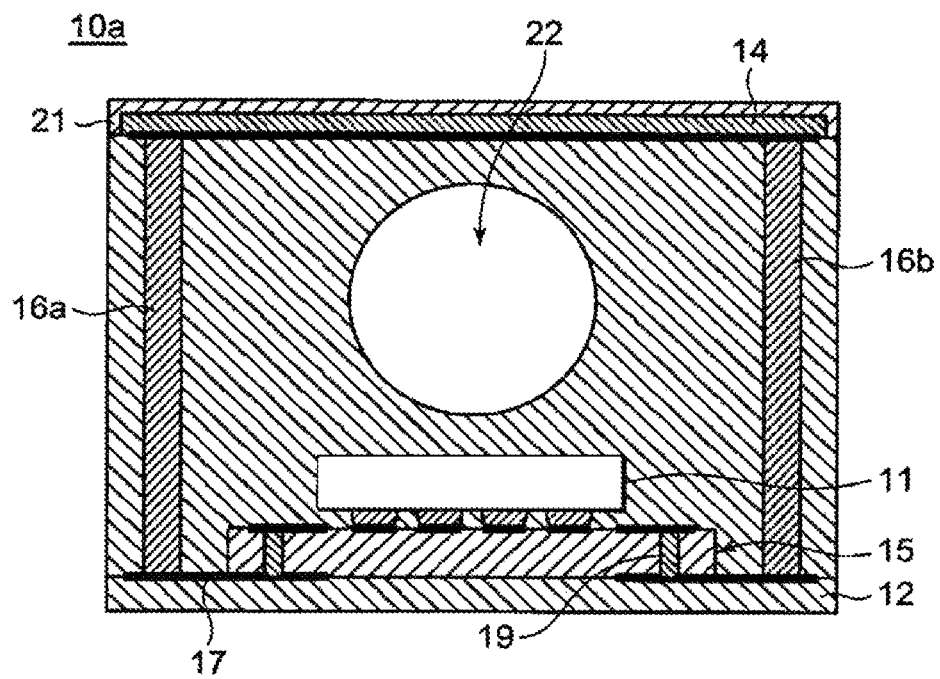
FIG. 15 is a cross-sectional view showing cross-sectional structure of an RFIC device of a second embodiment.

FIG. 15 is a cross-sectional view showing cross-sectional structure of an RFIC device 10a of a second embodiment. Different from the RFIC device of the first embodiment in which the metal pins 16a and 16b are directly mounted on the circuit board 15, in the RFIC device 10a of the second embodiment, the circuit board 15 and the metal pins 16a and 16b are separately mounted on another board (protective layer) 12. This design in which the metal pins 16a and 16b are not directly mounted on the circuit board 15 provides a high degree of freedom in designing.

(Third Embodiment)

Figure 16:
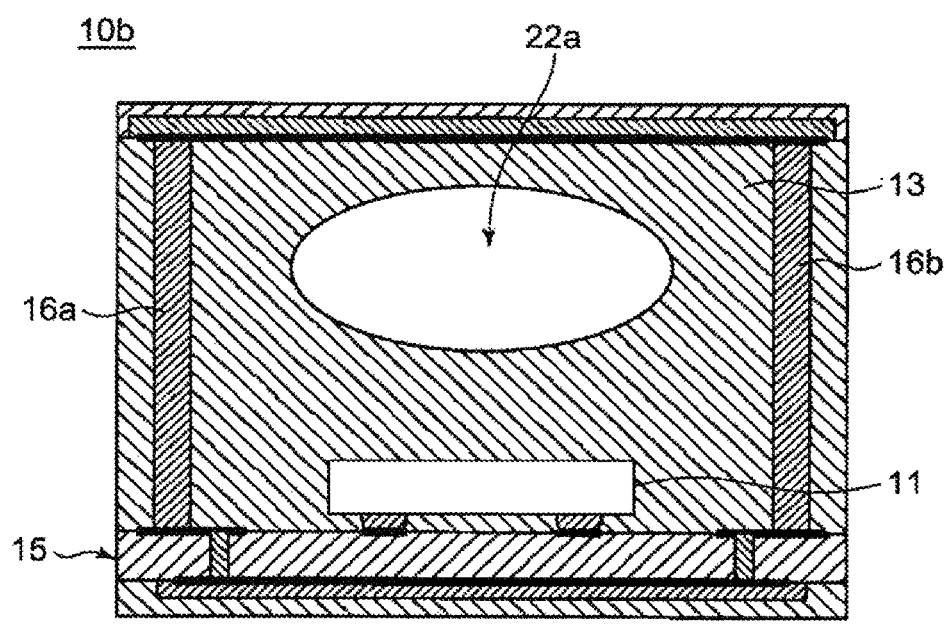
FIG. 16 is a cross-sectional view showing cross-sectional structure of an RFIC device of a third embodiment.

FIG. 16 is a cross-sectional view showing cross-sectional structure of an RFIC device 10b of a third embodiment. Different from the RFIC device of the first embodiment, in the RFIC device 10b of the third embodiment, a through-hole 22a is disposed off from the centers of the first and second surfaces to the side away from the RFIC element in the resin block 13. The through-hole 22a should preferably be disposed away from the RFIC element 11 in this way. The central axis of the coil antenna substantially passes through the centers of the first and second surfaces of the resin block 13 in most cases. The central axis of the through-hole 22a may thus be farther from the RFIC element 11 than the central axis of the coil antenna is. Since molding resin flows in the through-hole 22a, the through-hole 22a is subjected to high dynamic and thermal loads of molding resin. However, providing the through-hole 22a away from the RFIC element 11 allows molding resin to flow in a route away from the RFIC element 11, which reduces the dynamic and thermal loads of molding resin on the RFIC element 11.

(Fourth Embodiment)

Figure 17:
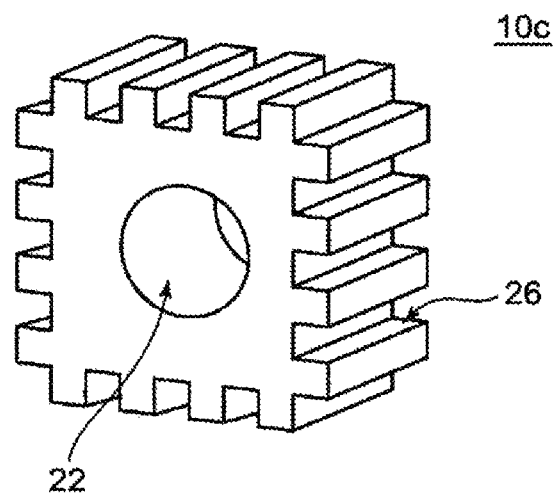
FIG. 17 is a schematic perspective view of an RFIC device of a fourth embodiment.
Figure 18:
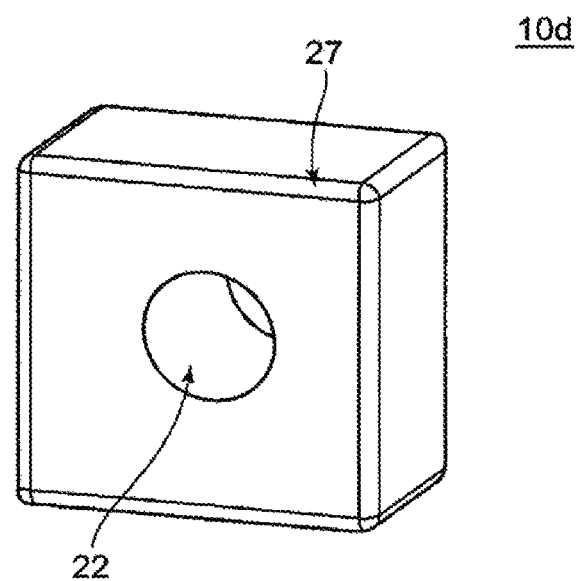
FIG. 18 is a schematic perspective view of an RFIC device of a fifth embodiment.

FIG. 17 is a schematic perspective view of a structure of an RFIC device 10c of a fourth embodiment. Different from the RFIC device of the first embodiment, in the RFIC device 10c of the fourth embodiment, the resin block 13 has a plurality of grooves 26 in the surface orthogonal to the first and second surfaces. In injection molding, the grooves 26 facilitate the flow of molding resin. This improves the flowability of molding resin and prevents occurrence of defects in molding.

(Fifth Embodiment)

FIG. 18 is a schematic perspective view of an RFIC device 10d of a fifth embodiment. Different from the RFIC device of the first embodiment, in the RFIC device 10d of the fifth embodiment, the edges of the first and second surfaces of the resin block 13 are chamfered. In injection molding, when molding resin comes into contact with the RFIC device 10d, the chamfered edges 27 allow the molding resin to continue to flow smoothly. This improves the flowability of molding resin and prevents occurrence of defects in molding.

(Sixth Embodiment)

Figure 19:
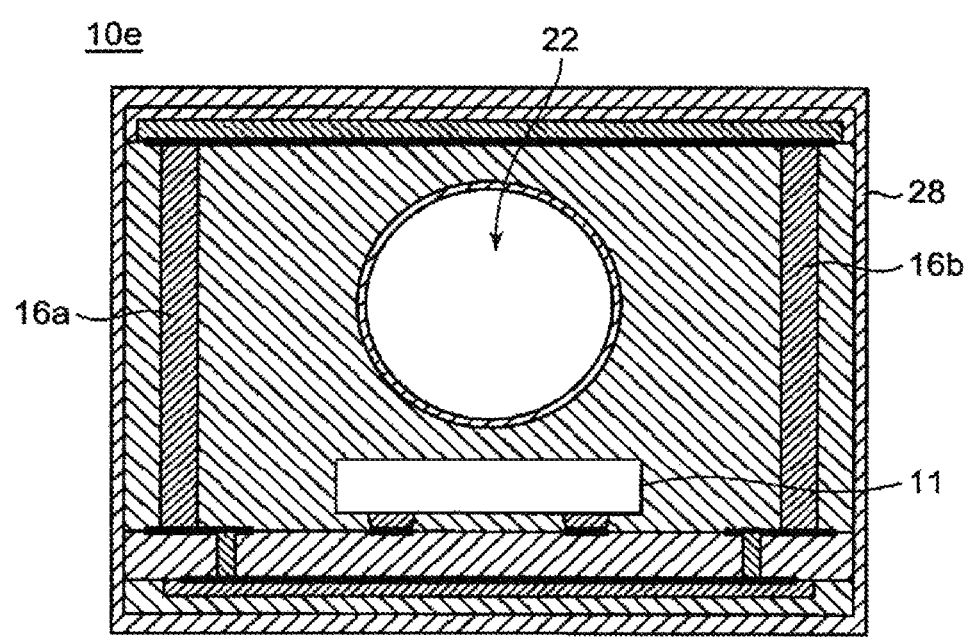
FIG. 19 is a cross-sectional view showing cross-sectional structure of an RFIC device of a sixth embodiment.

FIG. 19 is a cross-sectional view showing cross-sectional structure of an RFIC device 10e of a sixth embodiment. Different from the RFIC device of the first embodiment, in the RFIC device 10e of the sixth embodiment, RFIC device 10e has heat insulating material 28 to cover the resin block 13. This prevents rapid change in temperature in injection molding and prevents the RFIC element from being damaged.

In an exemplary aspect, the heat insulating material 28 may be inorganic heat insulating materials such as glass fibers and ceramics, or organic heat insulating materials such as polyimide resin, polyamide resin, and liquid polymer.

As for the method for covering the resin block 13 with the heat insulating material 28, the resin block 13 may be covered with the heat insulating material 28 by coating the resin block 13 with the heat insulating material 28 in a liquid form and curing the liquid heat insulating material, or coating the resin block 13 with the liquid containing the heat insulating material 28 dissolved or suspended in solvent and drying or vaporizing the solvent to remove the solvent. Alternatively, the resin block 13 may be immersed in the liquid heat insulating material or the liquid containing the heat insulating material dissolved or suspended in solvent to apply the coating to the resin block 13.

(Seventh Embodiment)

<RFIC Device>

Figure 20:
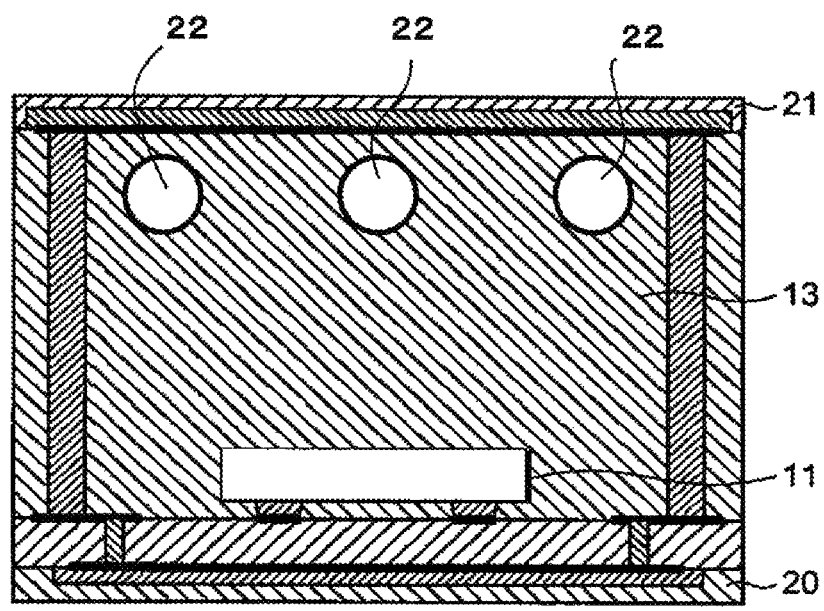
FIG. 20 is a cross-sectional view showing cross-sectional structure of an RFIC device of a seventh embodiment.

FIG. 20 is a cross-sectional view showing cross-sectional structure of an RFIC device 10f of a seventh embodiment. Different from the RFIC device of the first embodiment in which there is only the single through-hole 22, in the RFIC device 10f of the seventh embodiment, there are a plurality of through-holes 22. When making a resin molded body including the RFIC device 10f, the plurality of through-holes 22 increase the contact area of the RFIC device 10f with molding resin. This further stables the position of the RFIC device 10f in the resin molded body.

The through-holes 22 should preferably be disposed at the side away from the RFIC element 11. This protects the RFIC element 11 from the heat of molding resin flowing in the through-holes 22.

<Method for Manufacturing Resin Molded Body>

A method for manufacturing a resin molded body including the RFIC device 10f of the seventh embodiment is the same as the method for manufacturing a resin molded body including the RFIC device 10 of the first embodiment 1 as shown in FIG. 4. In injection molding with the RFIC device 10f, the RFIC device 10f is disposed in the mold 31 so that the through-holes 22 are aligned with a pin gate 32 of the mold 31. This configuration allows the molding resin 34 injected from the pin gate (resin injection port) 32 to smoothly flow into the through-holes 22.

Figure 21:
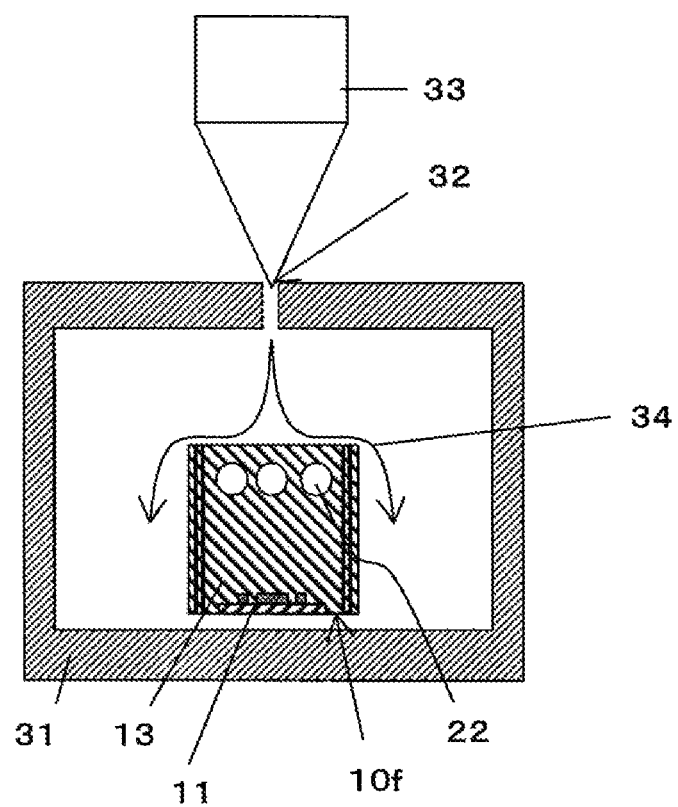
FIG. 21 is a schematic cross-sectional view showing a process of injecting molding resin into a mold with an RFIC device set inside in a method for manufacturing a resin molded body including the RFIC device of the seventh embodiment.
Figure 22:
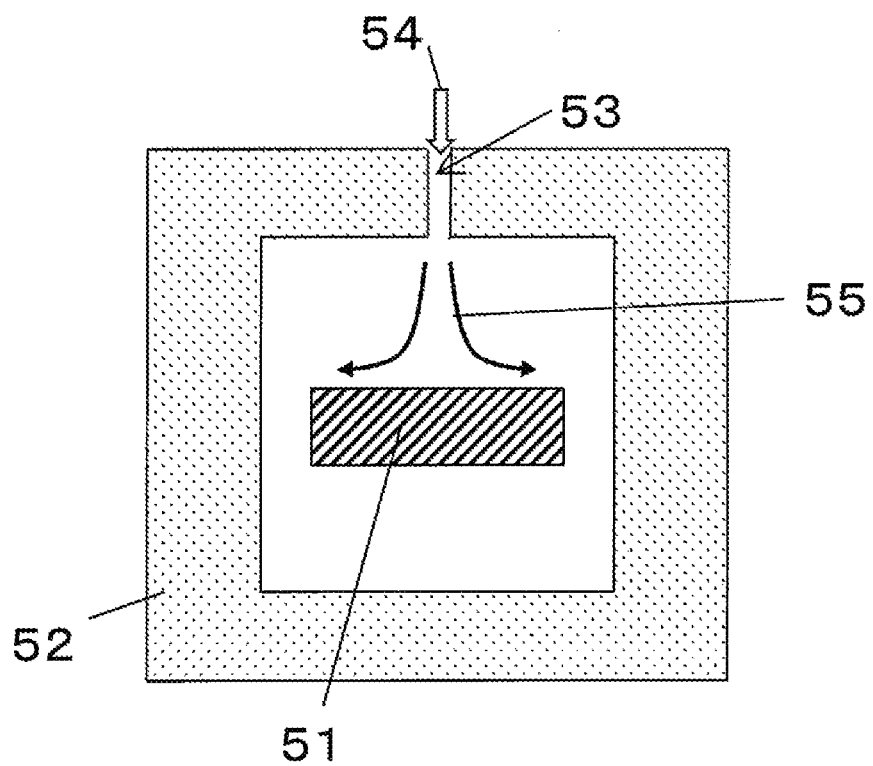
FIG. 22 is a schematic diagram showing the flow of resin in injection molding with a conventional RFID tag.

In manufacturing a resin molded body including any one of the RFIC devices 10 to 10f, the positional relationship between the through-hole(s) 22 and the pin gate 32 is not limited to the way shown in FIG. 4. As shown in FIG. 21, the axis(axes) of the through-hole(s) 22 may be disposed orthogonal to the pin gate 32, for example.

FIG. 21 is a schematic cross-sectional view showing a process of injecting molding resin into the mold 31 with the RFIC device 10f set inside in a method for manufacturing a resin molded body including the RFIC device 10f of the seventh embodiment. The method for manufacturing a resin molded body including the RFIC device 10f of the seventh embodiment will now be described with respect to steps (a) through (c).

(a) The RFIC device 10f is prepared such that the resin block 13 includes the RFIC element 11 disposed off from the center to one side and has a plurality of through-holes 22.

(b) The RFIC device 10f is disposed in the mold 31 so that the side of the resin block 13 to which the RFIC element 11 is disposed off from the center is in the downstream area of the flow of resin 34 in the mold 31. The downstream area of the flow of resin 34 is the area physically far from the resin injection port 32. The downstream area may be defined as the area that is cooler than the hot area around the resin injection port 32, which can be found by measuring the thermal gradient of molding resin. Since the side with the RFIC element 11 of the RFIC device 10f here is in the downstream area of the flow of resin 34, the side away from the RFIC element 11 is in the upstream area of the flow of resin 34.

(c) Molding resin stored in a resin container 33 is then injected from the resin injection port 32 into the mold 31 to embed the RFIC device 10f in the resin molded body.

The resin molded body including the RFIC device 10f can be obtained according to this exemplary manufacturing method.

According to the method for manufacturing a resin molded body of the seventh embodiment, the RFIC element 11 is disposed off from the center to one side of the resin block 13, and the RFIC device 10f is disposed in the mold 31 so that the side of the resin block 13 to which the RFIC element 11 is disposed off from the center is in the downstream area of the flow of resin 34. This configuration prevents the heat of resin from transferring to the RFIC element 11 and prevents the RFIC element 11 from being damaged. Since the side to which the RFIC element 11 is disposed off from the center is in the downstream area of the flow of resin in the mold 31, the RFIC element 11 can also endure the pressure of the flow of resin compared to cases where the side with the RFIC element 11 is in the upstream area.

In the method for manufacturing a resin molded body of FIG. 21, the RFIC device is not limited to the above RFIC device 10f. The RFIC device may be any one of the RFIC devices 10 to 10f described in this specification or all the RFIC devices within the scope of the present invention.

When the RFIC device is used as an RFID tag, the RFIC device may be used in any frequency band of an LF band, an HF band, a UHF band, and an SHF band. The RFIC device is typically used as an RFID tag, however, the RFIC device may have other functions such as a reading/writing function than a tag function.

The present invention includes any combination of the above embodiments, so that those combined embodiments can provide the advantageous effects of the original embodiments.

Since an RFIC devices of the exemplary embodiment have the through-hole(s) in the resin block, the RFIC devices are useful for injection molding for embedding the RFIC device including the RFIC element in a resin molded body.

DESCRIPTION OF REFERENCE SIGNS 1 coil antenna
2 central axis
10, 10a, 10b, 10c, 10d, 10e RFIC device
11 RFIC element
12 board (protective layer)
13 resin block
14 connecting conductor (wiring pattern)
15 circuit board
16, 16a, 16b metal pin
17 wiring pattern (printing)
17a first wiring pattern
17b second wiring pattern
17c third wiring pattern
17d fourth wiring pattern (printing)
18, 18a, 18b wiring pattern (plating)
19 interlayer connecting conductor
20 first protective layer
21 second protective layer
22, 22a through-hole
23 conductive connecting material
24 land pattern
25 polished surface
26 groove (slit)
27 chamfered edge
28 heat insulating material
30 resin molded body
31 mold
32 pin gate (resin injection port)
33 resin container
34 flow of resin
35 one end of coil antenna
36 first input/output terminal
37 the other end of coil antenna
38 second input/output terminal
51 RFID tag
52 mold
53 pin gate
54 molding resin
55 flow of resin

The invention claimed is:

1. A resin molded body, comprising:
   a radio frequency integrated circuit (RFIC) device including:
      a resin block having a first surface, a second surface facing the first surface, and a through-hole extending through the first and second surfaces;
      an RFIC element embedded in the resin block;
      a coil antenna disposed in the resin block and connected to the RFIC element, wherein the coil antenna has a coil axis that extends from the first surface to the second surface and the through-hole extends inside the coil antenna; and
   a molding resin that continuously covers the RFIC device and fills the through-hole of the RFIC device,
   wherein the RFIC element is disposed in the resin block and inside the coil antenna disposed in the resin block.

2. The resin molded body according to claim 1, wherein the coil antenna is structurally configured to transfer heat outside the resin block when the molding resin is filled in the through-hole of the RFIC device, such that the coil antenna prevents direct application of heat to the RFIC element.

3. The resin molded body according to claim 1, wherein the coil antenna is at least partially embedded in the resin block and includes at least one first metal pin and at least one second metal pin that extend inside the resin block on opposing sides of the through-hole.

4. The resin molded body according to claim 1, wherein the resin block is a polyhedral solid with the through-hole penetrating the first surface and the second surface, the first and second surfaces oppose each other, and the first surface has a largest surface area of the respective surfaces of the resin block.

5. The resin molded body according to claim 1, wherein the through-hole comprises a central axis that extends in a position offset relative the coil axis of the coil antenna to a side of the resin block that is away from the RFIC element when viewed in a direction orthogonal to the first surface of the resin block.

6. The resin molded body according to claim 1, wherein the coil antenna is a helical member that extends in a direction from the first surface to the second surface.

7. The resin molded body according to claim 1, wherein the coil antenna includes:
   a first pattern conductor disposed on an internal first surface of the resin block opposite to the RFIC element and orthogonal to the first and second surfaces of the resin block;
   at least one connecting conductor disposed on a circuit board on which the RFIC is mounted, with the circuit board embedded in the resin block on an internal second surface of the resin block opposite to the internal first surface; and
   at least one first metal pin and at least one second metal pin that each extend from the internal first surface to the internal second surface of the resin block to connect the first pattern conductor and the at least one connecting conductor, the at least one first metal pin and the at least one second metal disposed on opposing sides of the through-hole.

8. The resin molded body according to claim 1, wherein the resin block has a plurality of grooves in at least one outer surface that is orthogonal to the first and second surfaces.

9. The resin molded body according to claim 1, wherein respective edges of the first and second surfaces of the resin block are chamfered.

10. The resin molded body according to claim 1, wherein the RFIC device comprises a heat insulating material that covers the resin block.

11. The resin molded body according to claim 1, wherein the through-hole of the resin block is structurally configured to receive and distribute the molding resin during injection molding of the resin molded body.

12. The resin molded body according to claim 1, wherein the resin block comprises a plurality of through-holes extending through the first and second surfaces, and wherein the coil antenna extends circumferentially around the plurality of through-holes.

13. A method for manufacturing a resin molded body including an radio frequency integrated circuit (RFIC) device, the method comprising:
   disposing the RFIC device in a mold, the RFIC device including a resin block having a through-hole, an RFIC element embedded and disposed in the resin block, and a coil antenna disposed in the resin block, connected to the RFIC element with the RFIC element disposed inside the coil antenna, and surrounding the through-hole, so that the through-hole of the RFIC device faces a flow of a molding resin when the molding resin is injected into the mold; and injecting the molding resin from a resin injection port into the mold to embed the RFIC device in the resin molded body, such that the molding resin continuously covers the RFIC device and fills the through-hole of the RFIC device.

14. The method according to claim 13, wherein the coil antenna is structurally configured to transfer heat outside the resin block when the molding resin is injected into the mold and fills the through-hole of the RFIC device, such that the coil antenna prevents direct application of heat to the RFIC element.

15. The method according to claim 14, wherein the disposing of the RFIC device in the mold comprises positioning the through-hole of the RFIC device to face a pin gate in the mold, such that the molding resin is directing by the pin gate into the through-hole to fill the mold and the RFIC device does not block the flow of the molding resin into the mold.

16. The method according to claim 13, wherein the through-hole comprises a central axis that extends in a position offset from a coil axis of the coil antenna to a side of the resin block that is away from the RFIC element when viewed in a direction orthogonal to the resin block, such that the molding resin is routed away from the RFIC element during the injecting of the molding resin to reduce dynamic and thermal loads of the molding resin on the RFIC element.

17. The method according to claim 13, wherein the resin block has a plurality of grooves in at least one outer surface that facilitates flow of the molding resin during the injecting of the molding resin to prevent resin-absent cavities in the resin molded body.

18. The method according to claim 13, wherein respective outer edges of the resin block are chamfered to facilitate flow of the molding resin during the injecting of the molding resin to prevent resin-absent cavities in the resin molded body.

19. The method according to claim 13, further comprising covering the resin block with a heat insulating material to prevent a rapid change in temperature during the injecting of the molding resin into the mold.

20. The method according to claim 13, wherein the resin block includes a plurality of through-holes, such that the contact area between the RFIC device and the molding resin stabilizes a position of the RFIC device in the resin molded body during the injecting of the molding resin into the mold.

* * * * *